United States Patent [19]

Ohashi

[11] 4,351,195

[45] Sep. 28, 1982

[54] PUSHBUTTON TUNER

[75] Inventor: Tamaki Ohashi, Tokyo, Japan

[73] Assignee: Nihon Technical Kabushiki Kaisha, Tokyo, Japan

[21] Appl. No.: 140,445

[22] Filed: Apr. 17, 1980

[30] Foreign Application Priority Data

Apr. 18, 1979 [JP] Japan .................................. 54-46602

[51] Int. Cl.³ .......................... H03J 5/12; G05G 1/02
[52] U.S. Cl. ....................................... 74/10.33; 334/7
[58] Field of Search ................. 74/10.33, 10.37; 334/7

[56] References Cited

U.S. PATENT DOCUMENTS

| | | | |
|---|---|---|---|
| 2,319,472 | 5/1943 | Plensler | 74/10.33 X |
| 2,344,091 | 3/1944 | Kirk | 74/10.33 X |
| 4,204,179 | 5/1980 | Kataoka et al. | 74/10.33 X |

Primary Examiner—Allan D. Herrmann
Attorney, Agent, or Firm—Robert E. Burns; Emmanuel J. Lobato; Bruce L. Adams

[57] ABSTRACT

A pushbutton tuner includes a plurality of pushbutton actuators each effective to achieve a tuning to a desired preset frequency. Each pushbutton actuator includes a slide plate carried by a support plate so as to be movable between operative and inoperative positions, a lockable control plate pivotally mounted on the slide plate, a pair of upright pins fixedly mounted on the control plate, and a pair of cam members having their one end pivotally mounted on the support plate so that one of the upright pins engages one of the cam members as the slide plate moves to its operative position. A pair of movable plates are carried by the support plate so as to be movable across the slide plates. One of the movable plates is pivotally connected with the other end of one of the cam members while the other movable plate is pivotally connected with the other end of the other cam member. The pair of movable plates are interconnected by a link member which causes one of the movable plates to move in the opposite direction whenever the other movable plate moves in one direction in response to engagement of one upright pin with one of the cam members to cause angular movement thereof. When the other movable plate moves in the opposite direction from the movement of the one movable plate, the other cam member angularly moves in the opposite direction from that of the one cam member until it engages the other upright pin. When both upright pins engage the cam members, the cam members cease to rotate and a component of force acts at the points of engagement between the pins and the cam members in a direction to effectively prevent further rotation of the cam members. The position of the movable plates when further rotation of the cam members is prevented corresponds to the preset frequency.

5 Claims, 6 Drawing Figures

FIG. 1
FIG. 2
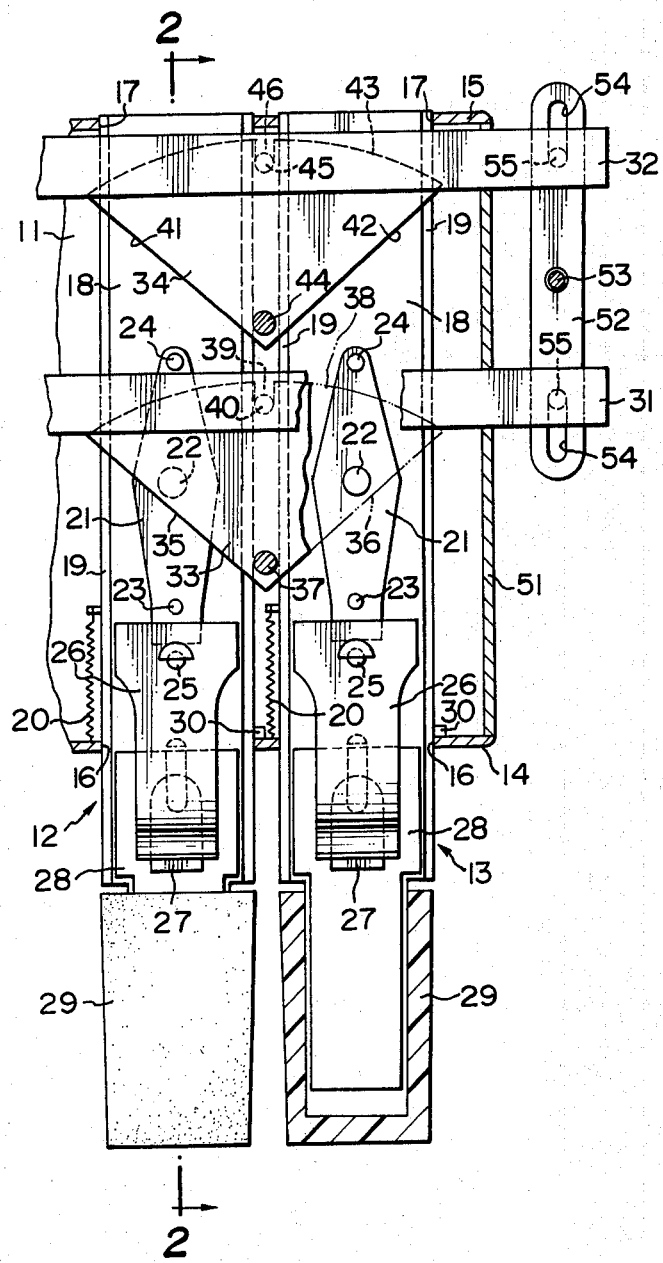
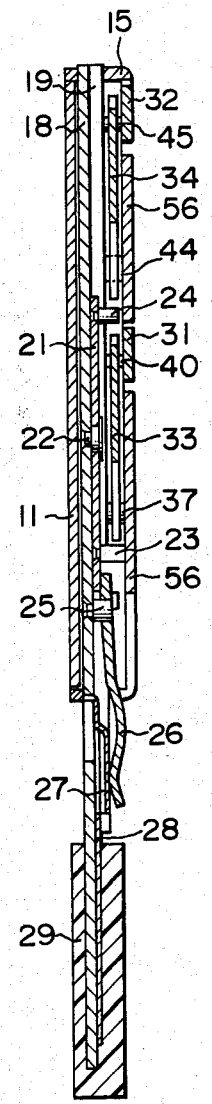

PUSHBUTTON TUNER

FIELD AND BACKGROUND OF THE INVENTION

The invention relates to a pushbutton tuner for a radio receiver, and more particularly, to a pushbutton tuner which achieves a precise tuning to a preset desired frequency associated with a particular pushbutton whenever the latter is driven to its operative position.

A pushbutton tuner is well known having a plurality of pushbuttons arranged to achieve a tuning to a plurality of preset frequencies so that whenever a particular pushbutton is driven to its operative position, a tuning to a corresponding frequency is achieved. Such a pushbutton tuner includes a plurality of manually operated slides in the form of flat plates which are arranged so that their surfaces are coplanar. Each of the slides is independently movable between its inoperative and its operative positions, and whenever one of the slides is driven to its operative position, a control member which is carried by the slide causes a displacement of a tuning element through a given distance, the element being disposed so as to be movable in a direction perpendicular to the direction of movement of the slide. The displacement of the tuning element operates an armature which is telescoped into a tuning coil of the tuner, thus achieving a tuning to a desired frequency. In order to realize a tuning to a particular frequency, the control member can be positioned relative to its corresponding slide and locked in position. Unless it is unlocked, the control member maintains its given orientation. The tuning element is formed with a plurality of notches one for each of the control members and which is adapted to be engaged by part of the control member corresponding to each of the slides. Usually, these notches are each formed as a pyramidal surface having one or two linear bevelled surfaces. When the part of the control member is engaged with the corresponding notch, and is driven along the bevelled surface of that notch in response to a force applied thereto, a component of the force causes the tuning element to move in a direction perpendicular to the applied force, with its movement continuing until it is constrained by the apex of the bevelled surface. The tuning element can also be controlled to a position corresponding to a desired frequency to be received by a manually rotatable knob which operates through a clutch. In this instance, if the unlocked control member is engaged with the apex of the corresponding bevelled surface, it can be positioned to provide a tuning to a particular frequency. When positioning the control member, the clutch maintains an operative connection between the rotatable knob and the tuning element, but is deactuated to interrupt the operative connection between the rotatable knob and the tuning element during a normal use when a selected slide is driven to its operative position in response to an operation of a pushbutton.

In the construction of such a conventional pushbutton tuner, each slide is slidably disposed in a slot formed in a baseplate or support plate and which guides the direction of movement of the slide. To support the slide in a slidable manner, the size of a slot must be greater than the outer profile of the slide in order to reduce the frictional resistance. However, an increased clearance between the slide and the slot may cause a rattling in the movement of the slide. When such rattling is present, if the control member is engaged with the apex of the bevelled surface in the notch which represents a reference position to provide a tuning to a desired frequency, the slide will be displaced by an amount corresponding to the degree of rattling, which displacement is transmitted to the tuning element to cause its misalignment. An error in the tuning accuracy of the tuning element will be caused even by a small displacement or rattling of the slide. If the pushbuttons are arranged to establish exact desired frequencies when the tuner assembly is initially calibrated, each subsequent operation of the pushbutton will result in a turning to an inaccurate offset frequency.

Investigations have revealed that in a pushbutton tuner of the type described, a displacement of the tuning element is caused principally by the use of a single tuning element, which displacement occurs in response to a component of the force applied to the control member even though the latter is engaged with the apex of the notch. Consequently, it is a task of the invention to provide an adequate accommodation of such component of the force.

SUMMARY OF THE INVENTION

It is an object of the invention to provide a pushbutton tuner which substantially avoids the occurrence of a tuning error.

It is another object of the invention to provide a pushbutton tuner which is simple in construction and can be manufactured within commercially acceptable tolerances without producing a tuning error.

In accordance with the invention, there is provided a pushbutton tuner including a support, tuning means mounted on the support so as to be movable to positions corresponding to preset tuning frequencies, and a plurality of pushbutton actuators which may be selectively preset to bring the tuning means to positions corresponding to the tuning frequencies, each pushbutton actuator including a slide member having its opposite ends carried by the support so as to be movable between its inoperative and its operative positions relative to the support in a direction perpendicular to the direction of movement of the tuning means, a lockable control member pivotally mounted on the slide member for controlling the movement of the tuning means, the tuning means including a pair of movable members, a link assembly having its each end pivotally connected with one of the movable members to cause a movement of one of the movable members whenever the other movable member is driven in the opposite direction, and means for transmitting the movement of the control member to at least one of the movable members to cause a movement of the latter movable member in one direction when the slide member is moved to its operative position, said one movable member ceasing to move in said one direction when a movement of the other movable member in the opposite direction which occurs in response to the movement of said one member is constrained by the control member.

In a preferred embodiment of the invention, there are provided a pair of transversely movable plates, and each of the pushbutton actuators includes a slide plate on which a control plate is disposed having upright pins on its opposite ends. The intermediate length of this control plate is pivotally mounted on the slide plate. One of the upright pins on the control plate engages a linear cam edge of a first cam member when a pushbutton is driven to its operative position. The first cam member has its one end pivotally mounted on a baseplate and has a notch formed in its other end which is engaged by an upstanding pin on one of the movable plates. The other upright pin on the control plate is located to be engageable with a linear cam edge of a second cam member which is pivotally mounted on the baseplate at its one end and which has a notch formed in its other end which is in turn engaged by an upstanding pin formed on the other movable plate. One end of each of the movable plates is pivotally connected to one end and the other end of a rockable link member which is pivotally mounted intermediate its length. Consequently, when the pushbutton is driven to its operative position, the force applied thereto causes one of the upright pins on the control plate to be engaged with the cam edge of one of the cam members, causing the latter to rotate in one direction. In response to such rotation, the movable plate which is connected to that cam member moves in one direction. This movement of the movable plate is effective to cause the other movable plate to move in the opposite direction from the movement of the first mentioned movable plate through the rockable link member. Then, the other cam member rotates in a direction opposite from the first mentioned cam member, the direction of its rotation being in the direction toward the other upright pin. When the other cam member engages with the other upright pin, the first mentioned cam member cannot rotate any further if an increased force is applied to the pushbutton, since the other cam member is prevented from rotating by the other upright pin. In this manner, the position of the movable members when they are made immovable corresponds to a given preset frequency. What is important here is that although components of the force applied to the pushbutton are developed at the points of engagement between the pair of upright pins and the pair of cam members, these components act in one direction, and a reaction force is exerted upon the slide plate through the control plate in order to mantain the slide plate urged against the edge of the slot in the baseplate which slidably supports the slide plate, thus removing any rattling therebetween. Therefore, no displacement of the movable plate is caused by such rattling, permitting an accurate tuning to a desired preset frequency. It will also be noted that these components of the force urge the pair of movable plates in the same direction, thus removing any rattling in the connection between the movable plates and the rockable link member.

The first and the second cam member may be substantially fan-shaped, including a pair of linear cam edges and an arcuate edge. One of the linear cam edges may be operatively engaged with the upright pin on the control plate of one of the pushbutton actuators while the other linear cam edge may be operatively engaged with the upright pin of the adjacent pushbutton actuator.

BRIEF DESCRIPTION OF THE DRAWINGS

FIG. 1 is a plan view, partly removed, of a pushbutton tuner according to one embodiment of the invention, illustrating the essential part thereof;

FIG. 2 is a longitudinal section taken along the line 2—2 shown in FIG. 1;

DESCRIPTION OF PREFERRED EMBODIMENTS

Figure 3:
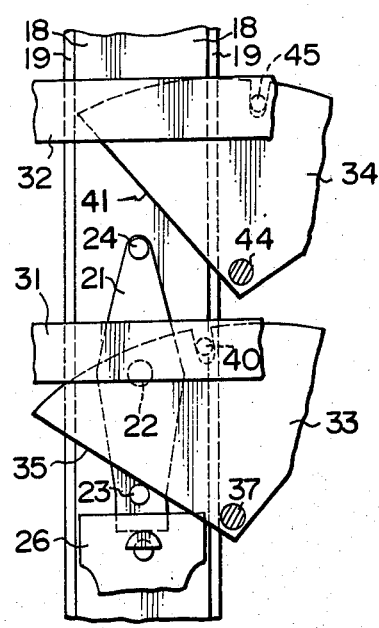
FIGS. 3, 4 and 5 are fragmentary plan views illustrating different relationships between the control plate and the cam members.

Referring to FIGS. 1 to 3, there is shown a pushbutton tuner according to the invention which includes a baseplate 11. A pair of pushbutton actuators generally designated by reference numerals 12, 13 are slidably disposed on the baseplate 11. Each pushbutton actuator is constructed in an identical manner, and hence only the actuator 12 will be described in detail. It should be understood that while only two actuators are shown in FIG. 1, the number of the pushbutton actuators need not be limited to two.

The baseplate 11 is integrally formed with a front and a rear wall 14, 15 which are formed with window slots 16, 17, respectively. The pushbutton actuator 12 includes a slide plate 18 which is slidably received in such slot 16 or 17. The slide plate 18 is integrally formed with upstanding ribs 19 lengthwise along its opposite lateral edges. A spring 20 has its one end connected to the slide plate 18 and its other end anchored to the front wall 14, whereby the slide plate 18 is normally biased forwardly or toward its inoperative position. In the specification, the term "front" refers to the side of the tuner which is located nearer an operator or the lower side as viewed in FIG. 1. In the similar sense, the term "rear" refers to the opposite side or the upper side as viewed in FIG. 1. A control plate 21 extending lengthwise of the slide plate 18 is pivotally mounted on top of the slide plate 18 by means of a pivot 22, and fixedly carries a pair of upright pins 23, 24 on the opposite ends of its upper surface. It will be understood that the angular orientation of the control plate 21 relative to the slide plate 18 can be adjusted, but is locked by a locking lever 26 which is mounted on a pin 25 secured to the upper surface of the slide plate 18. At this end, a preset plate 28 which carries a wedge portion 27 on its upper surface is slidably mounted on top of the slide plate 18, the wedge portion 27 acting to cause the locking lever 26 engage with the control plate 21. A pushbutton 29 is secured to the free end of the preset plate 28, and the free end of the slide plate 18 is detachably fitted into the pushbutton 29. One of the upstanding ribs 19 of the slide plate 18 is formed with a tab 30 which is disposed for abutment against the front wall 14, thus preventing a further movement of the slide plate 18 forwardly beyond its inoperative position under the action of the spring 20. Accordingly, when the pushbutton 29 is pulled forward from its inoperative position, only the preset plate 28 is driven away from the locking lever 26, releasing the control plate 21 to its reset position.

A pair of movable plates 31, 32 which lie in a common plane are disposed tranversely of an array of the slide plate 18, and are disposed parallel to each other. When the pushbutton 29 is operated to its operative position or driven rearwardly to cause a sliding movement of the slide plate 18 rearward, the movable plates 31, 32 are caused to move in a direction perpendicular to the direction of movement of the slide plate. The interlocking relationship between the slide plate 18 and the movable plates 31, 32 is achieved by a pair of fan-shaped front and rear cam members 33, 34. Specifically, the front cam member 33 is formed with a linear cam edge 35 which is adapted to engage the upright pin 23 on the actuator 12 whenever the pushbutton actuator 12 is driven rearward, another linear cam edge 36 which is adapted to engage the upright pin 23 on the adjacent actuator 13 whenever the latter is driven rearward. The cam member 33 is pivotally mounted by means of a pin 37 which is located adjacent to the point of intersection between the both cam edges 35, 36. The lower end of the pivot pin 37 extends through a clearance between the slide plates 18 of the adjacent pushbutton actuators 12, 13 and is secured to the baseplate 11. In this manner, the front cam member 33 is associated with a pair of adjacent pushbutton actuators 12, 13, and thus is capable of pivotal motion in response to either actuator. The front cam member 33 also includes an arcuate edge 38 which is centrally formed with a notch 39 into which the lower end of a connecting pin 40 having its upper end secured to the movable plate 31 is loosely fitted. The rear cam member 34 is similarly formed with a linear cam edge 41 engageable with the upright pin 234 on the pushbutton actuator 12, another linear cam edge 42 engageable with the upright pin 24 on the other pushbutton actuator 13, and an arcuate edge 43 which is formed with a notch 46. The cam member 34 is pivotally mounted on a pin 44, and is connected to the movable plate 32 through a connecting pin 45 which is loosely fitted into the notch 46. It is to be noted that the front and the rear cam member 33, 34 is located so as to be slidable over the upper end faces of the upstanding ribs 19 of the slide plates 18 associated with the pushbutton actuators 12, 13, and the movable plates 31, 32 are located above these cam members.

The baseplate 11 is provided with a pair of upstanding ribs 51 on its opposite lateral edges (the left-hand edge being not shown in FIG. 1), and the opposite ends of the movable plates 31, 32 are slidably carried by these ribs. While not shown, the upstanding ribs 51 on the baseplate 11 may be formed with notches or the like which prevent a movement of the movable plates 31, 32 in the fore-and-aft direction. One end of each movable plates 31, 32 is connected to a rockable link member 52 which is centrally fitted over an upright pin 53 secured to a frame, not shown, so as to be capable of oscillating about the pin 53. Adjacent to the opposite ends, the rockable link member 52 is formed with a pair of lengthwise elongate slots 54 which are engaged by pins 55 fixedly mounted on and depending downwardly from the lower surface of the movable plates 31, 32 adjacent to said one end. Numeral 56 in FIG. 2 represents a top cover which is disposed above the front and the rear cam member 33, 34 with a slight clearance, the opposite ends of the cover being secured to and supported by the upstanding ribs 51 on the opposite lateral edges of the baseplate 11.

It is to be understood that a variable tuning element is connected to either end of the movable plates 31, 32, and is controlled in response to a lateral movement of the movable plates 31, 32 to establish a predetermined tuning frequency which corresponds to the position of the movable plate, as is well understood in the art of pushbutton operated tuners. By way of example, reference may be made to U.S. Pat. No. 4,099,421 issued July 11, 1978, to the common assignee as the present application which discloses such an arrangement. This patent discloses a mechanism including a clutch which responds to an operation of a manually rotatable knob to adjust the movable plates and the variable tuning element to a position which corresponds to a frequency to be received. Such mechanism is directly applicable to the embodiment shown in the present application, and hence will not be described herein. The purpose of the clutch is to permit a movement of the movable plates and the variable tuning element whenever the knob is manually rotated, but to prevent a rotation of the knob whenever one of the pushbuttons is operated.

Figure 4:
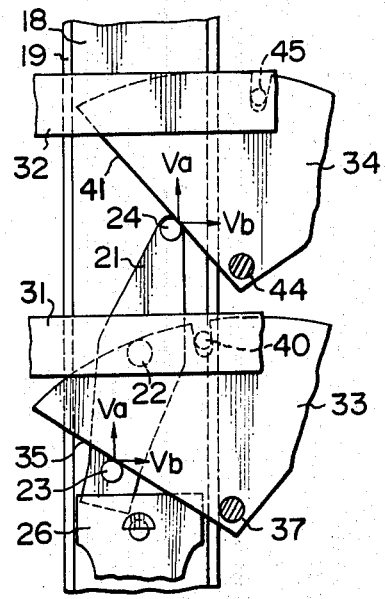

In operation, each pushbutton actuator must be adjusted so that it is tuned to a particular frequency. At this end, each control plate 21 is initially positioned relative to its associated cam members 33, 34. The positioning operation takes place by moving the pushbutton 29 forwardly of its inoperative position shown in FIG. 1, thus disengaging the wedge portion 27 of the preset plate 28 which is secured to the pushbutton 29 from the locking lever 26, thus unlocking the control plate 21. The knob is turned to adjust the variable tuning element so that it is tuned to a desired frequency. A movement of the variable tuning element is transmitted to either movable plate 31 or 32, causing the latter to move. Assume that the knob is turned to establish a desired frequency with the variable tuning element, and that the tuning element is now connected to the movable plate 32 which is driven to the right, as viewed in FIG. 1, as the tuning element is adjusted. The movement of the movable plate 32 to the right is transmitted through the rockable link member 52 to cause a movement of the movable plate 31 to the left. As the movable plates 31, 32 move in this manner, the cam members 33, 34 rotate counter-clockwise and clockwise, respectively, about their pivot pins 37, 44, respectively, from their positions shown in FIG. 1 to their positions shown in FIG. 3. If the pushbutton 29 is now driven rearward, the slide plate 18 moves rearward, whereby the upright pin 23 on the control plate 21 initially bears against the linear cam edge 35 of the front cam member 33, as shown in FIG. 3. As the pushbutton 29 is driven further rearward, the upstanding pin 23 tends to move rearward along the cam edge 35, with the consequence that the control plate 21 is turned clockwise about its pivot 22. The angular movement of the control plate 21 is stopped when the upright pin 24, which has been free, comes into abutment against the linear cam edge 41 of the rear cam member 34 (see FIG. 4). When the upright pins 23, 24 engage the cam edges 35, 41 of the respective cam members 33, 34, the upright pin 23 exerts a force to the cam member 33 which causes it to rotate clockwise. Such angular drive to the cam member 33 is transmitted through the connecting pin 40 to cause a movement of the movable plate 31 to the right. However, the movable plate 31 is connected to the movable plate 32 through the rockable link member 52, so that as the movable plate 31 moves to the right, this causes the movable plate 32 to move to the left. Such movement of the movable plate 32 is transmitted through the connecting pin 45 to cause an angular movement of the rear cam member 34 counter-clockwise, whereby the latter cam member 34 tends to rotate counter-clockwise. However, as mentioned previously, the upright pin 24 on the control plate 21 bears against the cam edge 41 of the cam member 34, thus preventing an angular movement thereof. In this manner, the pair of cam members 33, 34 are locked to each other through the upright pins 23, 24 on the control plate 21. Hence, the pushbutton 29 may be driven further to slip the wedge portion 27 of the preset plate 28 past the curved front end of the locking lever 26, causing the rear end of the locking lever 26 to strongly bear against the front end of the control plate 21. In this manner, the control plate 21 is locked in position shown in FIG. 4. Once the control plate is present in this manner, its position remains unchanged unless the pushbutton 29 is brought to its reset position as mentioned initially. It is to be noted that an increased force as compared with that required during a normal pushbutton operation is necessary to slip the preset plate 28 into the space between the slide plate 18 and the locking lever 26. On the other hand, it is desirable that a usual channel selection can be achieved with a reduced force applied to the pushbutton 29. At this end, the slots 16, 17 formed in the walls 14, 15 of the baseplate 11 into which the slide plates 18 are received are chosen to be slightly greater than the profile of the slide plate 18, thus reducing the frictional resistance which these slide plates experience. Stated differently, the slide plates 18 are disposed in the slots 16, 17 with a certain clearance therebetween. Hence it will be understood that this in turn may cause a rattling of the slide plates 18 in the slots 16, 17 when the increased force is applied in the manner mentioned above, with consequent displacement of the movable plates 31, 32 though slightly. Such displacement results in a corresponding displacement of the variable tuning element to cause a mistuning. However, in the present embodiment, it will be seen from FIG. 4 that when a force $V_a$ is applied to the upright pins 23, 24 on the control plate 21 from the pushbutton 29, which causes the pins to move in the direction of movement of the slide plate 18, a component of force $V_b$ is developed which tends to turn the cam members 22, 34 clockwise. Because these components $V_b$ act in the same direction, the cam members 33, 34 which are connected together through the rockable link member 52 are prevented from rotating relative to each other, thus precluding a displacement of the movable plates 31, 32. If a clearance is present between the right-hand upstanding rib 19 on the slide plate 18 and the edge of either slot 16, 17, the slide plate 18 cannot move so long as the upright pins 23, 24 on the control plate 21 remain engaged with the cam members 33, 34. If a clearance is present between the left-hand upstanding rib 19 on the slide plate 18 and the edge of either slot 16, 17, the upright pins 23, 24 will move to the left by an amount corresponding to the clearance, along the cam edges 35, 41 of the cam members 33, 34, resulting in a slight movement of the slide plate 18 to the left, but without accompanying a corresponding movement of the movable plates 31, 32.

Figure 5:
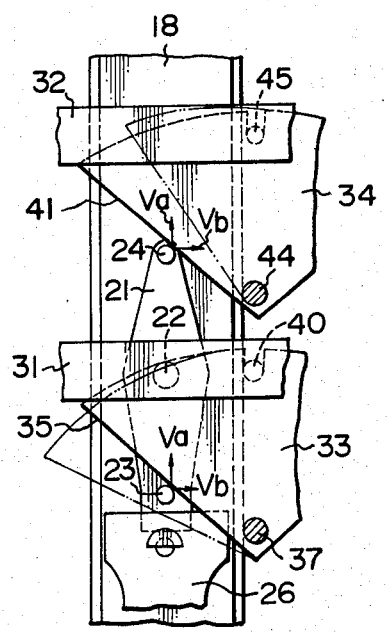

Referring now to FIG. 5, a usual channel selection after the individual pushbutton actuators have been adjusted to achieve respective desired frequencies will be described. It is assumed that the cam members 33, 34 are caused to assume their positions shown in phantom line as a result of an operation of another pushbutton. As the pushbutton 29 (see FIG. 1) is driven inward to cause a rearward movement of the slide plate 18, the upright pin 23 on the control plate 21 initially engages the linear cam edge 35 of the cam member 33, which therefore turns clockwise, causing the movable plate 31 to move to the right. This in turn causes a movement of the movable plate 32 to the left through the rockable link member 52 shown in FIG. 1, whereby the rear cam member 34 turns counter-clockwise from the position shown in phantom line. As the slide plate 18 is driven further rearward, the upright pin 24 on the control plate 21 bears against the cam edge 41 of the cam member 34, which is therefore prevented from rotating further counter-clockwise. In this manner, the cam member 33 is prevented from rotating, precluding a further rearward movement of the slide plate 18. The positions of the movable plates 31, 32 when such rearward movement is blocked correspond to a preset frequency which is established for a particular pushbutton actuator.

When a channel selection is achieved through the engagement on the upright pins 23, 24 with the pair of cam members 33, 34 concurrently, a component of the force $V_b$ is exerted upon each point of engagement in response to the force applied to the pushbutton 29. As mentioned previously, these components $V_b$ are developed to act in the same direction, whereby a reaction force acts on the slide plate 18 through the control plate 21, urging the slide plate 18 to move to the left, as viewed in FIG. 5, thereby removing any clearance or rattling between the side of the slide plate 18 and the edge of either slot 16, 17 in the baseplate 11.

Figure 6:
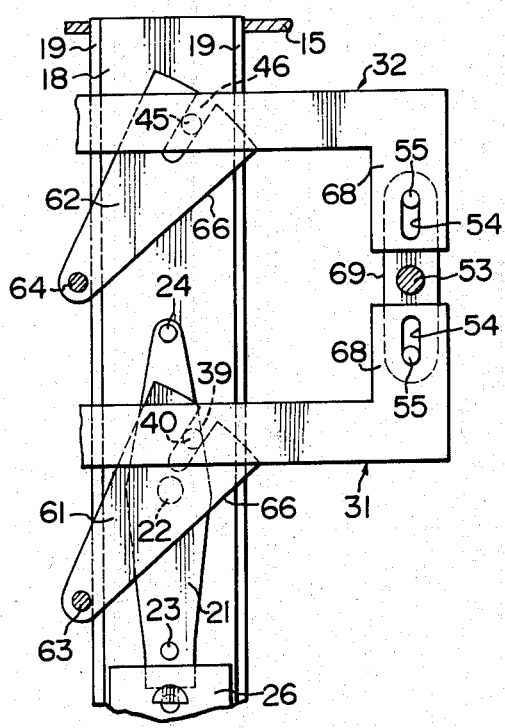
FIG. 6 is a fragmentary plan view of another embodiment of the invention.

In the embodiment described above, the front and the rear cam member are used in common by the pair of pushbutton actuators. In an embodiment shown in FIG. 6, a pair of cam members 61, 62 are provided for each actuator. The cam members 61, 62 are pivotally mounted on pivot pins 63, 64 respectively. The front cam member 61 is formed with a linear cam edge 65 which is adapted to be engaged by the front upright pin 23 on the control plate 21 while the rear cam member 62 is formed with a linear cam edge 66 which is adapted to be engaged by the rear upright pin 24. In this embodiment, ends 67, 68 of the movable plates 31, 32 which are located nearer the rockable link member 52 are bent at right angles to the remainder thereof to permit the use of a rockable link member 69 having a reduced length. Except for the arrangement that the pair of cam members 61, 62 are provided for each actuator and that the rockable link member 69 has a reduced length, the arrangement and operation of the second embodiment is similar to those described above in connection with the first embodiment, and hence will not be repeated. It is to be noted that corresponding parts are designated by like reference characters in FIG. 6 as those used in FIGS. 1 to 5. Since each pushbutton actuator is associated with its own cam members, it is quite easy to increase or decrease the number of pushbutton actuators. In a pushbutton tuner having five pushbutton actuators, the cam members mentioned above in connection with the first embodiment may be used in connection with four of the pushbutton actuators while the pair of cam members associated with the remaining one actuator may be constructed as shown in FIG. 6.

What is claimed is:

1. A pushbutton tuner including a support, tuning means mounted on the support so as to be movable to positions corresponding to preset tuning frequencies, and a plurality of pushbutton actuators which may be selectively preset to bring the tuning means to positions corresponding to the tuning frequencies, each pushbutton actuator including a slide member having its opposite ends carried by the support so as to be movable between inoperative and operative positions relative to the support in a direction perpendicular to the direction of movement of the tuning means, a lockable control member pivotally mounted on the slide member for controlling the movement of the tuning means, the control member extending lengthwise of the slide member and fixedly carrying upright pins on its opposite ends, the tuning means including a pair of movable members, a link assembly having its each end pivotally connected with one of the movable members to cause a movement of one of the movable members whenever the other movable member is driven in the opposite direction, and means for transmitting the movement of the control member to at least one of the movable members to cause a movement of the latter movable member in one direction when the slide member is moved to its operative position, said one movable member ceasing to move in said one direction when a movement of the other movable member in the opposite direction which occurs in response to the movement of said one member is constrained by the control member, the transmitting means including a first and a second cam member each having its one end pivotally mounted on the support, the other end of the first and the second cam member being pivotally connected with one and the other of the movable members, respectively, each of the first and the second cam member having a cam edge, one of the cam edges being effective to cause an angular movement of one of the cam members in one direction in response to its engagement with one of the upright pins to thereby cause a movement of the other movable member in the opposite direction from the movement of said one movable member, the other cam edge being brought into engagement with the other upright pin to block the angular movement of the other cam member.

2. A pushbutton tuner according to claim 1 in which the rockable link member is pivotally mounted on the support intermediate its ends in which lengthwise elongate slots are formed which are in turn pivotally engaged by pivot pins fixedly mounted on one end each of the pair of movable members, the movement of one of the movable members determining the associated frequency.

3. A pushbutton tuner according to claim 1 in which the first and the second cam member are each formed with another cam edge which is operatively engageable with the upright pins on the adjacent pushbutton actuator, whereby the first and the second cam member are shared by a pair of pushbutton actuators.

4. A pushbutton tuner according to claim 1 in which the pair of movable members each carry an upright pin which is loosely fitted into an elongate slot formed in the upper end of the first and the second cam member so as to extend toward said one end thereof.

5. A pushbutton tuner according to claim 3 in which the pair of movable members each carry an upright pin and in which each of the first and the second cam member is substantially fan-shaped having a pair of linear cam edges and an arcuate edge, the cam members being pivotally mounted on the support at a point adjacent to the point of intersection between the pair of linear cam edges, an elongate slot extending toward the point of intersection being formed intermediate the ends of the acruate edge and being loosely engaged by the upright pin.

* * * * *